(12) United States Patent
Ota

(10) Patent No.: US 10,649,004 B2
(45) Date of Patent: May 12, 2020

(54) CONTACT TERMINAL, INSPECTION JIG, AND INSPECTION APPARATUS

(71) Applicant: NIDEC READ CORPORATION, Kyoto (JP)

(72) Inventor: Norihiro Ota, Kyoto (JP)

(73) Assignee: NIDEC-READ CORPORATION, Kyoto (JP)

( * ) Notice: Subject to any disclaimer, the term of this patent is extended or adjusted under 35 U.S.C. 154(b) by 48 days.

(21) Appl. No.: 16/026,088

(22) Filed: Jul. 3, 2018

(65) Prior Publication Data

US 2019/0011479 A1    Jan. 10, 2019

(30) Foreign Application Priority Data

Jul. 4, 2017    (JP) ................. 2017-131402

(51) Int. Cl.
    *G01R 1/04*    (2006.01)
    *H01R 13/24*    (2006.01)
    (Continued)

(52) U.S. Cl.
    CPC ....... *G01R 1/0416* (2013.01); *G01R 1/06722* (2013.01); *G01R 1/06738* (2013.01);
    (Continued)

(58) Field of Classification Search
    CPC ............ G01R 1/06716; G01R 1/06722; G01R 1/06727; G01R 1/07328; G01R 31/2601; G01R 31/2886; G01R 1/0416
    (Continued)

(56) References Cited

U.S. PATENT DOCUMENTS

| 4,935,696 A | * | 6/1990 | DiPerna | ............. G01R 1/07378 |
| | | | | 324/72.5 |
| 6,677,772 B1 | * | 1/2004 | Faull | .................. G01R 1/06722 |
| | | | | 324/755.05 |

(Continued)

FOREIGN PATENT DOCUMENTS

| JP | 2013053931 A | 3/2013 |
| WO | 2014017402 A1 | 1/2014 |

OTHER PUBLICATIONS

The Extended European Search Report issued in a counterpart EP application No. 18181358.5, dated Nov. 19, 2018, 5 pages (Reference Purpose Only).

*Primary Examiner* — Patrick Assouad
*Assistant Examiner* — Demetrius R Pretlow
(74) *Attorney, Agent, or Firm* — Viering, Jentschura & Partner mbB

(57) ABSTRACT

A contact terminal may include a tubular body made of an electrically conductive material; and stick-shaped first and second central conductors made of an electrically conductive material. The first and second central conductors may include first and second stick-shaped bodies, first and second clasped portions configured to have a diameter greater than that of each of the first and second stick-shaped bodies, and first and second swell portions configured to have a diameter greater than that of each of the first and second stick-shaped bodies. The first and second central conductors are arranged to have a distal end portion of the first and second swell portions inserted into a joining portion of the tubular body, and to have a distal end surface of the first swell portion and a distal end surface of the second swell portion opposite each other with a gap therebetween.

18 Claims, 11 Drawing Sheets

(51) Int. Cl.
*G01R 1/067* (2006.01)
*G01R 1/073* (2006.01)

(52) U.S. Cl.
CPC ..... *G01R 1/07335* (2013.01); *H01R 13/2421* (2013.01); *H01R 2201/20* (2013.01)

(58) Field of Classification Search
USPC .......................... 324/754.03, 754.08–754.09, 324/754.12–754.14, 755.01–755.03
See application file for complete search history.

(56) References Cited

U.S. PATENT DOCUMENTS

| | | | | |
|---|---|---|---|---|
| 8,408,946 | B1* | 4/2013 | Sochor | H01R 4/4863 324/755.01 |
| 9,109,294 | B2* | 8/2015 | Kojima | C25D 1/02 |
| 9,583,857 | B2* | 2/2017 | Nasu | G01R 1/06722 |
| 10,041,974 | B2* | 8/2018 | Li | G01R 1/06722 |
| 2004/0029412 | A1* | 2/2004 | Hachuda | G01R 1/06722 439/66 |
| 2005/0184747 | A1* | 8/2005 | Sanders | G01R 1/06722 324/755.05 |
| 2009/0221186 | A1* | 9/2009 | Nakayama | G01R 1/07314 439/660 |
| 2010/0007365 | A1 | 1/2010 | Ishizuka et al. | |
| 2010/0123476 | A1* | 5/2010 | Kazama | G01R 1/06722 324/755.01 |
| 2011/0025358 | A1* | 2/2011 | Kazama | G01R 1/07371 324/755.01 |
| 2013/0057308 | A1* | 3/2013 | Yang | G01R 3/00 324/755.01 |
| 2013/0057309 | A1* | 3/2013 | Kojima | C25D 1/02 324/755.05 |
| 2014/0162503 | A1* | 6/2014 | Yamada | H01R 4/4863 439/786 |
| 2014/0247065 | A1* | 9/2014 | Yamada | G01R 1/06722 324/755.05 |
| 2015/0168455 | A1* | 6/2015 | Anraku | C22C 5/04 324/754.03 |
| 2015/0247882 | A1* | 9/2015 | Lee | G01R 1/06722 324/755.05 |
| 2015/0253356 | A1* | 9/2015 | Kuo | G01R 1/07307 324/755.05 |
| 2015/0369859 | A1* | 12/2015 | Suzuki | G01R 1/06722 324/755.08 |
| 2017/0122978 | A1 | 5/2017 | Li et al. | |
| 2017/0229802 | A1* | 8/2017 | Kazama | H01R 13/24 |
| 2018/0011127 | A1* | 1/2018 | Teranishi | G01R 1/04 |
| 2018/0080955 | A1* | 3/2018 | Hsieh | G01R 1/06722 |
| 2018/0238957 | A1* | 8/2018 | Nakamura | G01R 31/26 |
| 2019/0004090 | A1* | 1/2019 | Yamamoto | G01R 1/06733 |

* cited by examiner

CONTACT TERMINAL, INSPECTION JIG, AND INSPECTION APPARATUS

CROSS-REFERENCE TO RELATED APPLICATIONS

This application claims priority to Japanese Application No. 2017-131402 filed on Jul. 4, 2017, which is entirely incorporated herein by reference.

TECHNICAL FIELD

The present disclosure relates to a contact terminal used to inspect an inspection target, an inspection jig to bring the contact terminal into contact with the inspection target, and an inspection apparatus including the inspection jig.

BACKGROUND

A known contact terminal for use in an inspection apparatus includes a tubular body (i.e., a cylindrical member) including a spring portion defined in a middle thereof, and a columnar central conductor (i.e., a stick-shaped member) inserted through the tubular body, and a known inspection jig uses this contact terminal (see, for example, JP-A 2013-53931). In this contact terminal, the central conductor is fixed to the tubular body in the vicinity of an end of the tubular body through, for example, welding or crimping, with an end portion of the central conductor protruding from the tubular body. Once a first end portion of the tubular body is brought into contact with an electrode portion, and a second end portion of the central conductor is brought into contact with an inspection target, the first end portion of the tubular body and the second end portion of the central conductor are urged toward the electrode portion and the inspection target, respectively, in accordance with elastic resilience of the spring portion, whereby the contact of the contact terminal with the electrode portion and the inspection target is stabilized.

In the aforementioned inspection jig, however, a test electric current passes from the first end portion of the tubular body, which is in contact with the electrode portion, to the second end portion of the central conductor, which is in contact with the inspection target, through the spring portion, and the passing of the electric current through the spring portion causes an increase in inductance or impedance.

SUMMARY

A contact terminal according to a non-limiting embodiment of the present disclosure may include a tubular body being tubular, and made of an electrically conductive material; and a first central conductor and a second central conductor each of which is made of an electrically conductive material, and is in the shape of a stick. The first central conductor includes a first stick-shaped body configured to have an outside diameter smaller than an inside diameter of the tubular body, and to be inserted into a first end portion of the tubular body; a first clasped portion at a proximal end portion of the first stick-shaped body, and configured to have a diameter greater than that of the first stick-shaped body; and a first swell portion at a distal end portion of the first stick-shaped body, and configured to have a diameter greater than that of the first stick-shaped body. The second central conductor may include a second stick-shaped body configured to have an outside diameter smaller than the inside diameter of the tubular body, and to be inserted into a second end portion of the tubular body; a second clasped portion at a proximal end portion of the second stick-shaped body, and configured to have a diameter greater than that of the second stick-shaped body; and a second swell portion at a distal end portion of the second stick-shaped body, and configured to have a diameter greater than that of the second stick-shaped body. The tubular body may include a first clasping portion configured to clasp the first clasped portion; a second clasping portion configured to clasp the second clasped portion; a first spring portion defined by a helical body contiguous with the first clasping portion; a second spring portion defined by a helical body contiguous with the second clasping portion; and a tubular joining portion configured to join the first and second spring portions to each other. The first and second central conductors may be arranged to have a distal end portion of each of the first and second swell portions inserted into the joining portion, and to have a distal end surface of the first swell portion and a distal end surface of the second swell portion kept opposite to each other with a gap therebetween.

Accordingly, at the time of inspecting, for example, a board using the contact terminal, a predetermined gap is secured between an inner circumferential surface of the tubular body and each of the first and second stick-shaped bodies, and each of the first and second swell portions is brought into contact with the joining portion of the tubular body. This makes it possible to bring the first and second central conductors into electrical connection with each other through the joining portion without an electric current passing through the first and second spring portions of the tubular body. This reduces the possibility that an increase in inductance or impedance will be caused by any spring portion of the contact terminal.

Moreover, when the first and second central conductors have been fitted into the tubular body, the tubular body is almost entirely reinforced by the first and second stick-shaped bodies, ensuring sufficient mechanical strength of the contact terminal. Furthermore, the possibility that a compression of each of the first and second spring portions will be interrupted is reduced because the first and second central conductors are configured to have the distal end surfaces of the first and second swell portions kept opposite to each other with a gap therebetween while preventing a contact between the distal end portion of the first swell portion and the distal end portion of the second swell portion.

The above and other elements, features, steps, characteristics and advantages of the present disclosure will become more apparent from the following detailed description of the non-limiting embodiments with reference to the attached drawings.

The non-limiting embodiment of the contact terminal having the above-described structure, an inspection jig including the contact terminal, and an inspection apparatus including the inspection jig are able to reduce the possibility of increased inductance or impedance.

BRIEF DESCRIPTION OF THE DRAWINGS

FIG. 6A is a front view illustrating the end portion of the tubular body in an enlarged form, FIG. 6B is a bottom view of the tubular body as viewed from a lower side in FIG. 6A, and FIG. 6C is a front view illustrating the clasping portion in a developed state.

DETAILED DESCRIPTION

Figure 1:
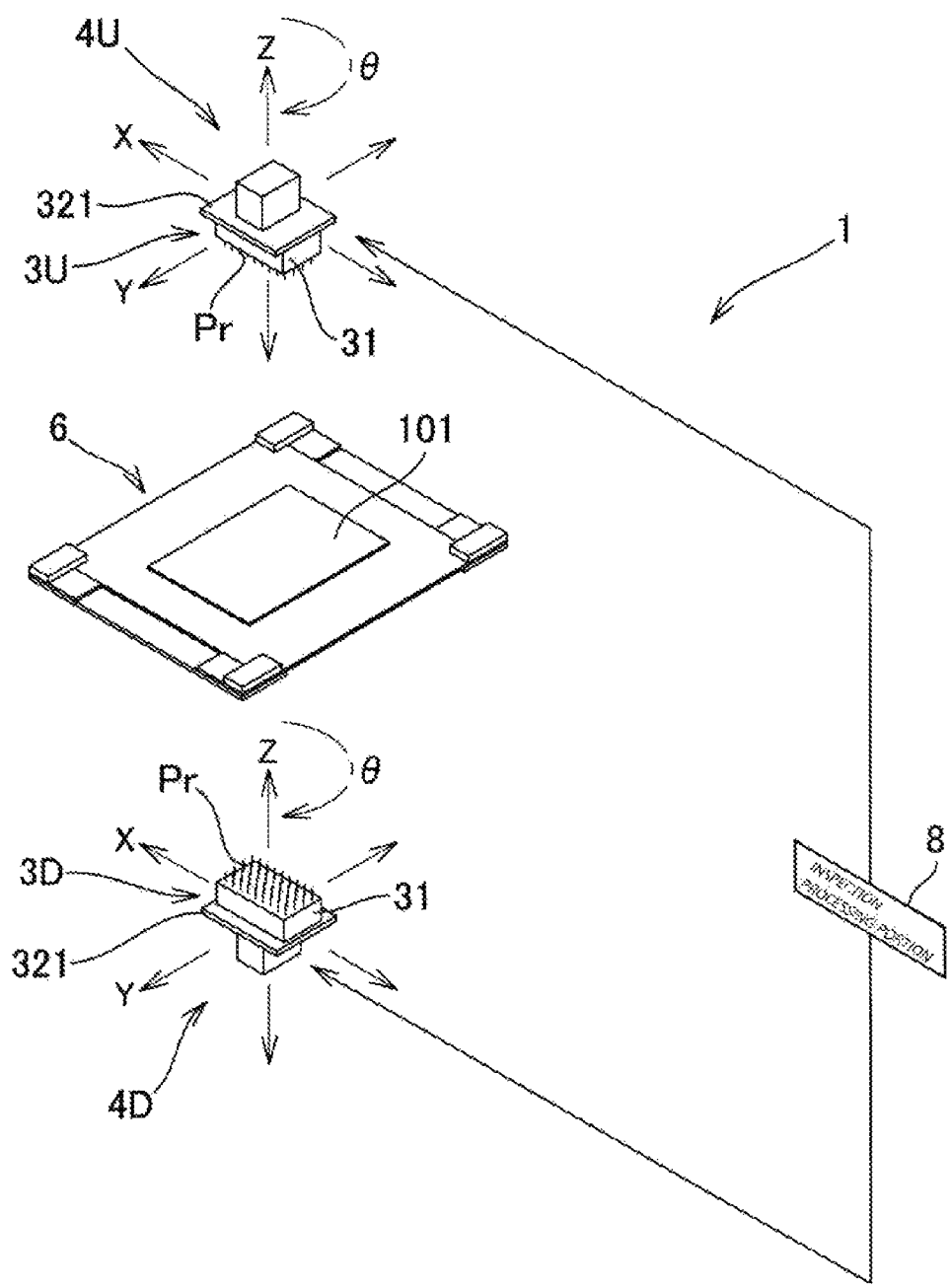
FIG. 1 is a perspective view schematically illustrating the structure of a board inspection apparatus including inspection jigs and contact terminals according to a first non-limiting embodiment of the present disclosure.

Hereinafter, non-limiting embodiments of the present disclosure will be described with reference to the accompanying drawings. In the accompanying drawings, like parts are designated by like reference characters, and redundant description will be omitted.

FIG. 1 is a schematic diagram schematically illustrating the structure of a board inspection apparatus 1 including inspection jigs and contact terminals according to a first non-limiting embodiment of the present disclosure. The board inspection apparatus 1 corresponds to an example of an inspection apparatus. The board inspection apparatus 1 illustrated in FIG. 1 is an apparatus used to inspect a circuit pattern formed on a board 101, which is an example of an inspection target.

Various types of boards can be used as the board 101, including, for example, a printed circuit board, a flexible board, a ceramic multilayer circuit board, an electrode plate for use in a liquid crystal display or a plasma display, a semiconductor substrate, a package board for use in a semiconductor package, and a film carrier. The inspection target may not necessarily be a board, but may alternatively be, for example, an electronic component in a semiconductor device (e.g., an integrated circuit (IC)) or the like, or any other object on which an electrical inspection is to be performed.

The board inspection apparatus 1 illustrated in FIG. 1 includes inspection portions 4U and 4D, a board fixing device 6, and an inspection processing portion 8. The board fixing device 6 is configured to fix the board 101 to be inspected at a predetermined position. The inspection portions 4U and 4D include inspection jigs 3U and 3D, respectively. The inspection portions 4U and 4D are arranged to support the inspection jigs 3U and 3D, respectively, using a driving mechanism (not shown) such that the inspection jigs 3U and 3D are capable of moving in x-axis, y-axis, and z-axis directions perpendicular to each other, and are capable of rotating about a z-axis.

The inspection portion 4U is arranged above the board 101, which is fixed by the board fixing device 6. The inspection portion 4D is arranged below the board 101, which is fixed by the board fixing device 6. The inspection jigs 3U and 3D, each of which is configured to inspect a circuit pattern formed on the board 101, are detachably disposed in the inspection portions 4U and 4D, respectively. The inspection portions 4U and 4D include connectors connected to the inspection jigs 3U and 3D, respectively. Hereinafter, the inspection portions 4U and 4D will be collectively referred to as an inspection portion 4 as appropriate.

Each of the inspection jigs 3U and 3D includes a plurality of probes (i.e., contact terminals) Pr, a support member 31 configured to support the probes Pr, and a base plate 321. Each probe Pr corresponds to an example of a contact terminal. The base plate 321 is provided with electrodes, which will be described below and each of which is to be brought into contact with, and electrical connection with, a first end portion of a separate one of the probes Pr. Each of the inspection portions 4U and 4D includes a connection circuit (not shown) configured to bring a rear end of each probe Pr into electrical connection with the inspection processing portion 8 through the corresponding electrode provided in the base plate 321, or make a switch in the connection.

Each probe Pr is configured to have a substantially stick-like overall shape, and a specific structure of the probe Pr will be described in detail below. The support member 31 includes a plurality of through holes each of which is configured to support a separate one of the probes Pr. Each through hole is arranged at a position corresponding to the position of an inspection point set on a wiring pattern on the board 101, which is the inspection target, so that one end portion of each probe Pr can be brought into contact with an inspection point in the board 101. For example, the probes Pr are disposed at positions corresponding to points of intersection on a grid. The grid is oriented such that horizontal and vertical lines of the grid extend in the x-axis and y-axis directions perpendicular to each other. Each inspection point is, for example, a wiring pattern, a solder bump, a connection terminal, or the like.

The inspection jigs 3U and 3D are similar in structure except in the arrangement of the probes Pr and in that the inspection jigs 3U and 3D are attached in opposite directions, i.e., upwardly and downwardly, to the inspection portions 4U and 4D, respectively. Hereinafter, the inspection jigs 3U and 3D will be collectively referred to as an inspection jig 3 as appropriate. The inspection jig 3 can be replaced with another inspection jig in accordance with the type of the board 101 to be inspected.

The inspection processing portion 8 includes, for example, a power supply circuit, a voltmeter, an ammeter, a microcomputer, and so on. The inspection processing portion 8 is configured to control the driving mechanism (not shown) to move and position each of the inspection portions 4U and 4D to bring each probe Pr into contact with the corresponding inspection point in the board 101. Each inspection point is thus electrically connected to the inspection processing portion 8.

The inspection processing portion 8 is configured to supply a test electric current or voltage to each inspection point in the board 101 through the probes Pr of the inspection jigs 3 in the above-described situation, and inspect the board 101 for, for example, a disconnection in a circuit pattern, a short circuit, or the like on the basis of a voltage signal or a current signal obtained from each probe Pr. Alternatively, the inspection processing portion 8 may be configured to supply an alternating current or voltage to each inspection point, and thus measure an impedance of the inspection target on the basis of a voltage signal or a current signal obtained from each probe Pr.

Figure 2:
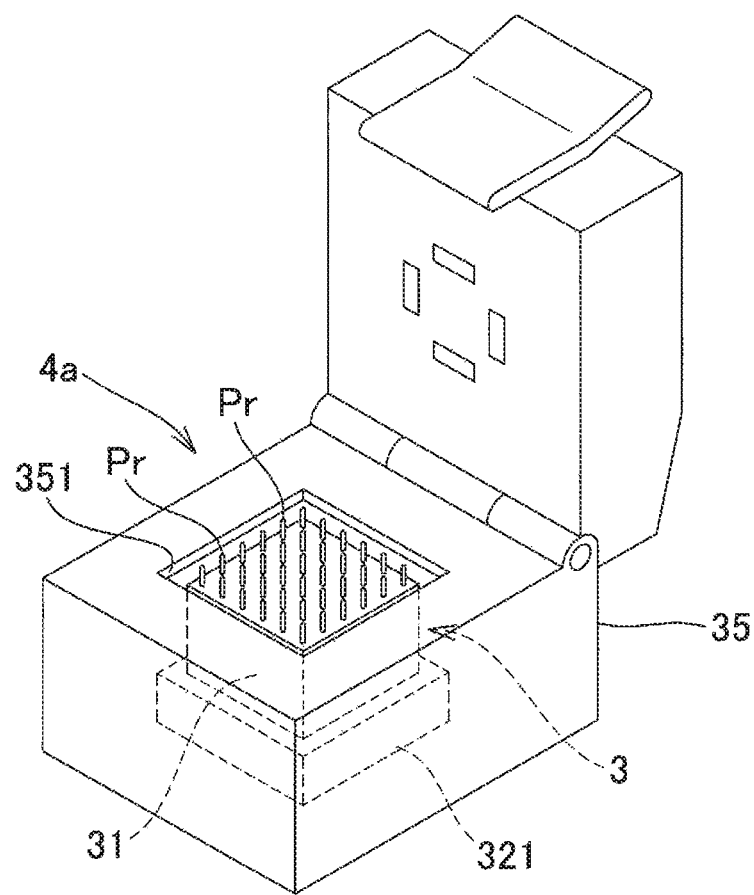
FIG. 2 is a perspective view illustrating another example of an inspection portion which may be provided in the inspection apparatus as illustrated in FIG. 1.

FIG. 2 is a perspective view illustrating another example of an inspection portion 4 which may be provided in the board inspection apparatus 1 illustrated in FIG. 1. An inspection portion 4a illustrated in FIG. 2 includes a so-called IC socket 35 and an inspection jig 3 installed in the IC socket 35. Unlike the inspection portion 4, the inspection portion 4a is not provided with a driving mechanism, and is configured to bring probes Pr into contact with pins, bumps, electrodes, or the like of an IC mounted on the IC socket 35. The inspection apparatus can be configured as an IC inspection apparatus by replacing the inspection portions 4U and 4D illustrated in FIG. 1 with the inspection portion 4a, and setting, for example, a semiconductor device (e.g. an IC) as the inspection target.

Figure 3:
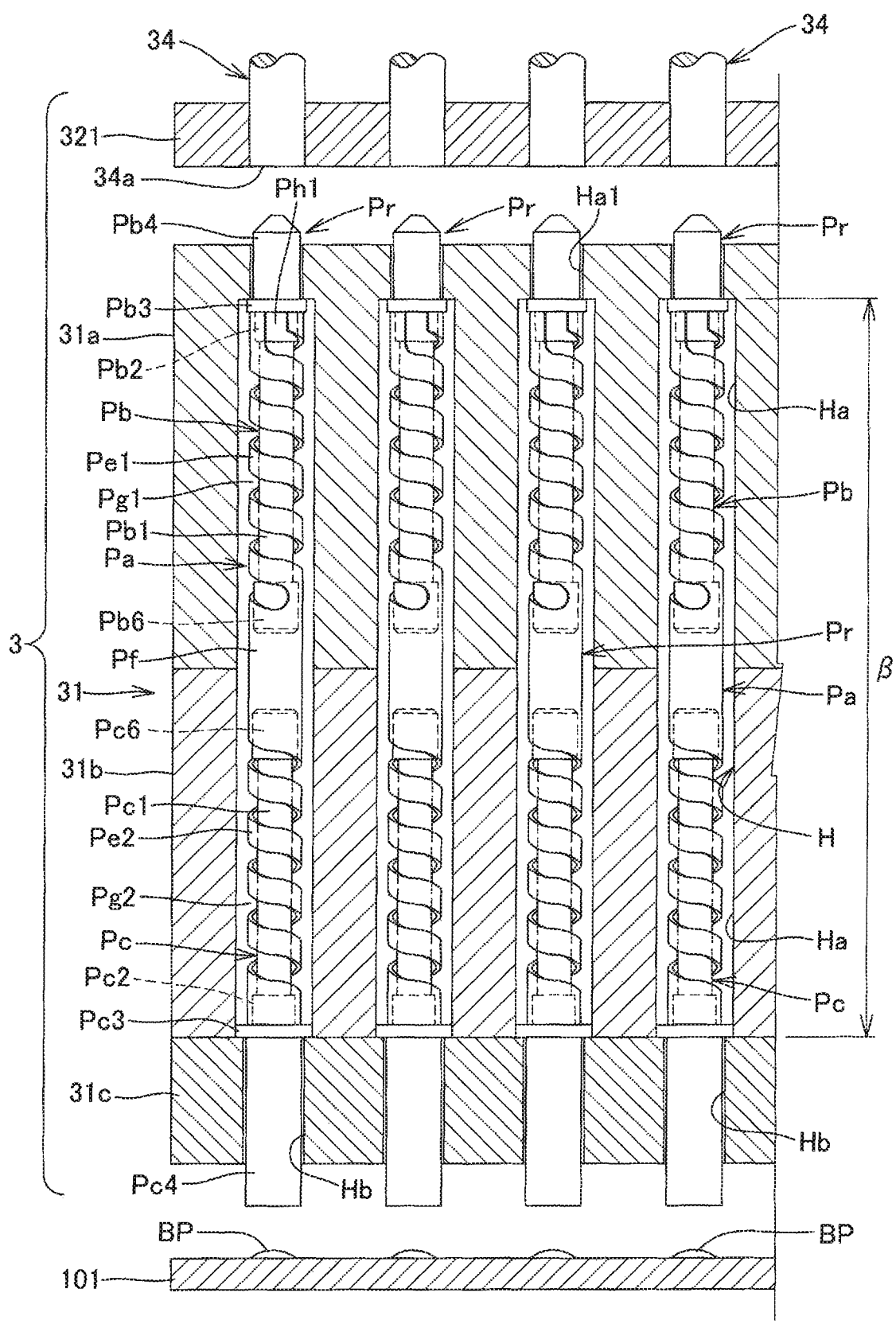
FIG. 3 is a schematic sectional view illustrating an example structure of the inspection jig illustrated in FIGS. 1 and 2.

FIG. 3 is a schematic diagram illustrating an example structure of the inspection jig 3 including the support member 31 and the base plate 321 illustrated in FIG. 1. The support member 31 illustrated in FIG. 3 is defined by, for example, plate-shaped support plates 31a, 31b, and 31c placed one upon another. The support plate 31a, which is arranged on the upper side in FIG. 3, is disposed at a first end portion of the support member 31, while the support plate 31c, which is arranged on the lower side in FIG. 3, is disposed at a second end portion of the support member 31. In addition, the support member 31 includes a plurality of through holes H each of which is configured to pass through the support plates 31a, 31b, and 31c.

Each of the support plates 31a and 31b includes insert hole portions Ha each of which is defined by an opening hole having a predetermined diameter. The support plate 31c includes through holes each of which is defined by a narrow portion Hb having a diameter smaller than that of each insert hole portion Ha. In addition, the support plate 31a, which is arranged on the upper side, includes decreased diameter portions Ha1 each of which has a hole diameter smaller than that of each insert hole portion Ha, in a portion of the support plate 31a which lies at a surface opposite to the base plate 321 (i.e., on a first-end side), which will be described below, that is, in the first end portion of the support member 31. Then, the decreased diameter portion Ha1 and the insert hole portion Ha in the support plate 31a, the insert hole portion Ha in the support plate 31b, and the narrow portion Hb in the support plate 31c are connected with each other to define each through hole H.

Note that the entire through hole H may alternatively be defined by an insert hole portion Ha having the predetermined diameter, with the narrow portion Hb and the decreased diameter portion Ha1, each of which has a smaller diameter, being omitted. Also note that the support plates 31a and 31b of the support member 31 may not necessarily be placed one upon the other, but may alternatively be spaced from each other with, for example, a support or the like being configured to join the support plates 31a and 31b to each other. Also note that the support member 31 may not necessarily be defined by the plate-shaped support plates 31a, 31b, and 31c placed one upon another, but may alternatively be defined by, for example, a single monolithic member including the through holes H.

Figure 7:
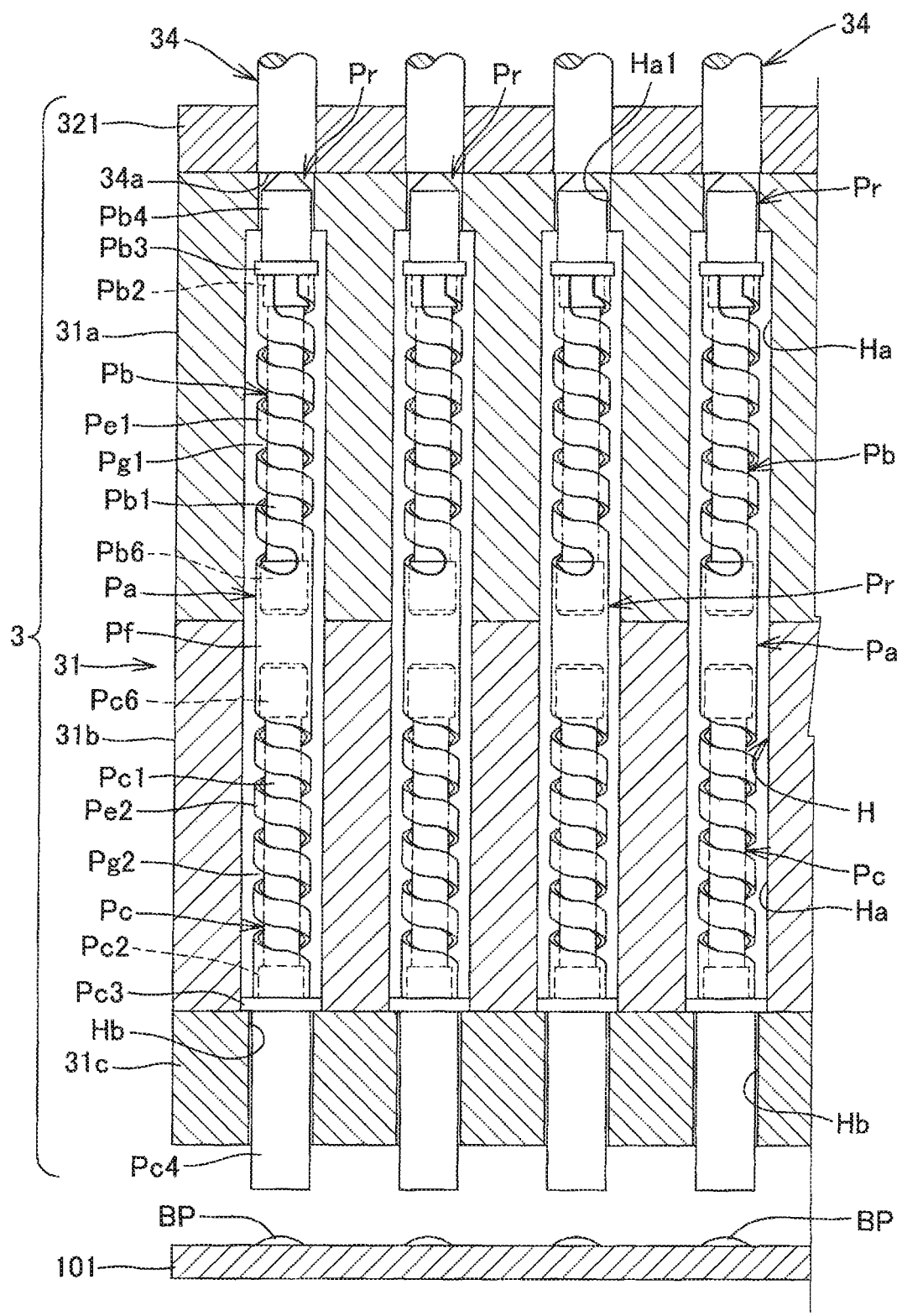
FIG. 7 is a diagram corresponding to FIG. 3, and illustrates a situation in which a base plate has been attached to a support member according to the first non-limiting embodiment of the present disclosure.

The base plate 321, which is made of, for example, an insulating resin material, is attached to a first-end side of the support plate 31a, so that a first-end opening portion of each through hole H, i.e., a first-end side of each decreased diameter portion Ha1, is closed with the base plate 321 (see FIG. 7). Wires 34 are attached to the base plate 321 such that each wire 34 passes through the base plate 321 at a position opposite to the first-end opening portion of a separate one of the through holes H. A surface of the base plate 321 on a second-end side, which faces the support plate 31a, and an end surface of each wire 34 are configured to be flush with each other. The end surface of each wire 34 forms an electrode 34a.

Each of the probes Pr, which are inserted into the respective through holes H of the support member 31 and are thus attached to the support member 31, includes a tubular body Pa, a first central conductor Pb, and a second central conductor Pc. The tubular body Pa is tubular, and is made of an electrically conductive material. Each of the first and second central conductors Pb and Pc is made of an electrically conductive material, and is in the shape of a stick.

Figure 4:
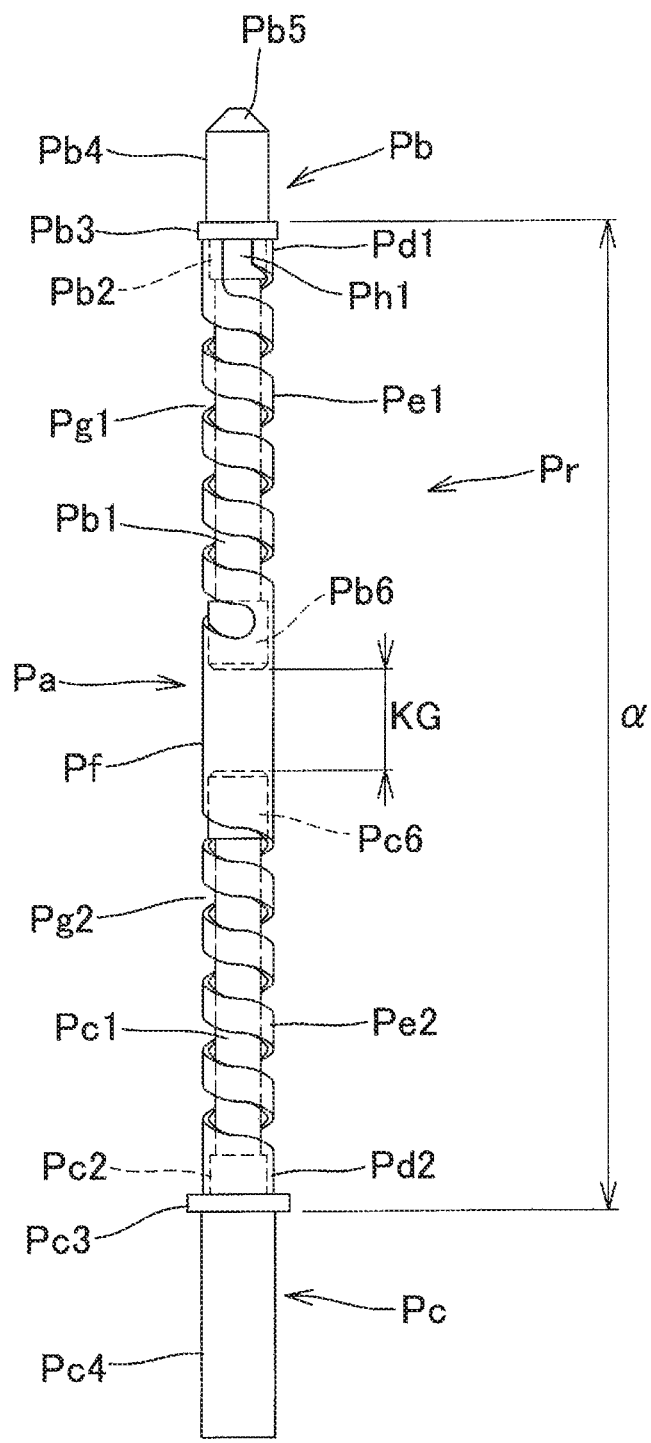
FIG. 4 is a front view illustrating a specific structure of a probe according to the first non-limiting embodiment of the present disclosure.
Figure 5:
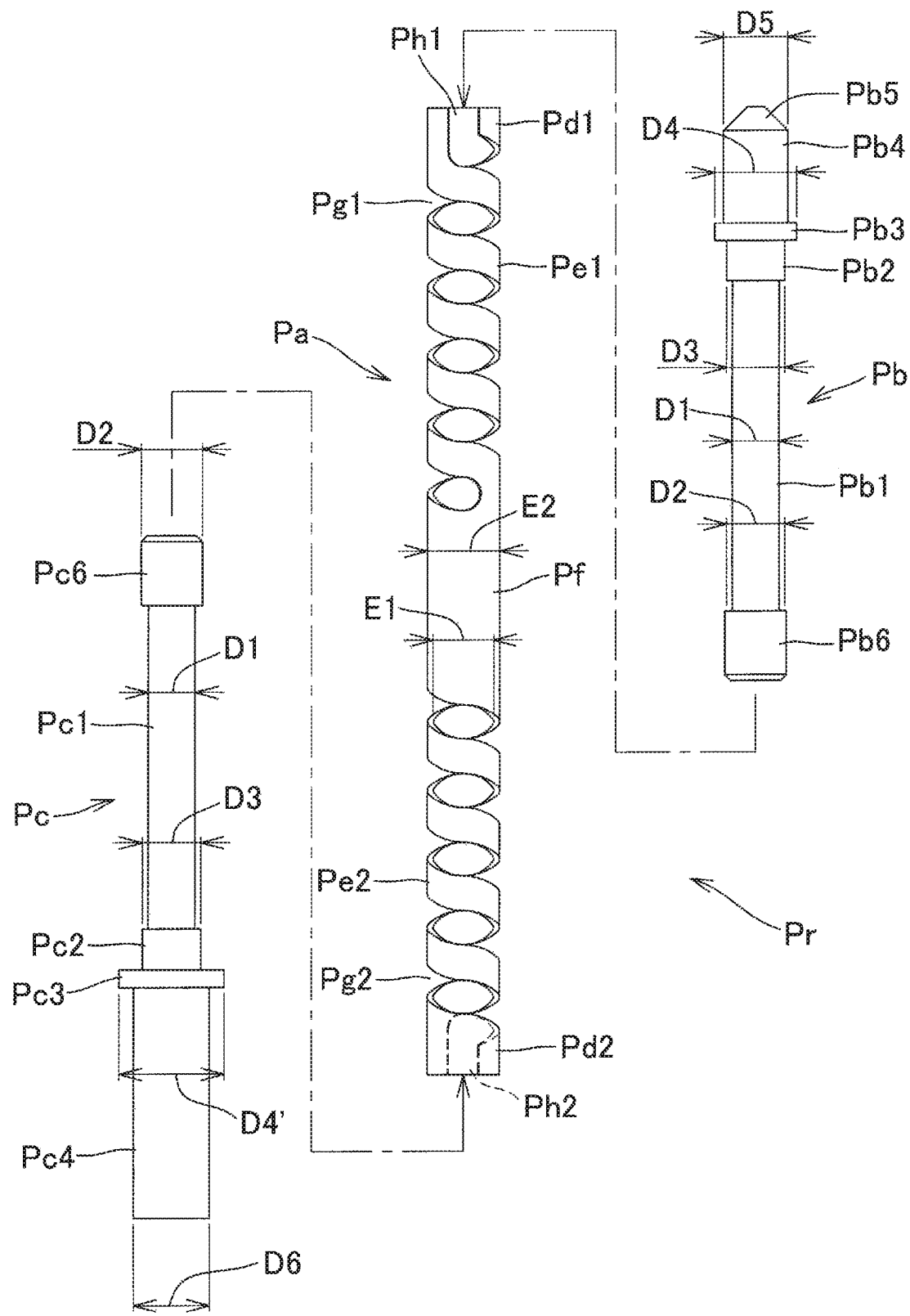
FIG. 5 is a front view illustrating the structure of the probe, illustrating a tubular body, a first central conductor, and a second central conductor of the probe separately.

FIG. 4 is a front view illustrating a specific structure of the probe Pr, and FIG. 5 is an explanatory exploded view of the probe Pr, illustrating the tubular body Pa, the first central conductor Pb, and the second central conductor Pc separately. A nickel or nickel alloy tube having an outside diameter E2 of about 25 to 300 μm and an inside diameter E1 of about 10 to 250 μm, for example, can be used to define the tubular body Pa.

The tubular body Pa may be configured to have, for example, an outside diameter E2 of about 120 μm, an inside diameter E1 of about 100 μm, and a total length of about 1700 μm. In addition, an inner circumference of the tubular body Pa may be coated with a plating layer, such as, for example, a gold plating layer, and an outer circumference of the tubular body Pa may be coated with an insulating coating as necessary.

The tubular body Pa includes a first clasping portion Pd1 and a second clasping portion Pd2 at both end portions thereof. The first clasping portion Pd1 and the second clasping portion Pd2 are configured to clasp proximal end portions of a first stick-shaped body Pb1 and a second stick-shaped body Pc1, respectively, as described below. The tubular body Pa further includes, between the first and second clasping portions Pd1 and Pd2, a first spring portion Pe1 and a second spring portion Pe2, each of which has a predetermined length and is capable of expanding and contracting in an axial direction of the tubular body Pa. The tubular body Pa further includes, in a longitudinal middle of the tubular body Pa, a joining portion Pf configured to join the first and second spring portions Pe1 and Pe2 to each other.

For example, a laser beam is emitted from a laser beam machine (not shown) onto a circumferential wall of the tubular body Pa to define a first helical groove Pg1 and a second helical groove Pg2 in the circumferential wall of the tubular body Pa, so that the first and second spring portions Pe1 and Pe2, each of which is defined by a helical body extending along a peripheral surface of the tubular body Pa, are defined. Then, the tubular body Pa is configured to be capable of expanding and contracting in the axial direction thereof through deformation of the first and second spring portions Pe1 and Pe2.

Note that the first and second spring portions Pe1 and Pe2, each of which is defined by a helical body, may alternatively be defined by, for example, performing etching on the circumferential wall of the tubular body Pa to define the first and second helical grooves Pg1 and Pg2 therein. Also note that the first and second spring portions Pe1 and Pe2, each of which is defined by a helical body, may alternatively be defined by, for example, electroforming.

The joining portion Pf, which is configured to join the first and second spring portions Pe1 and Pe2 to each other, is defined by a portion of the circumferential wall of the tubular body Pa which is left where the first and second helical grooves Pg1 and Pg2 are not defined in the tubular body Pa, and is configured to have a predetermined length in the middle portion of the tubular body Pa.

Referring to FIG. 5, the first clasping portion Pd1 is defined by a portion of the circumferential wall of the tubular body Pa at which portions of the tubular body Pa are separated by a first slit Ph1 extending from a first end portion of the first helical groove Pg1 (i.e., an upper end portion of the first helical groove Pg1 in the figure) to a first end portion of the tubular body Pa (i.e., an upper end portion of the tubular body Pa in the figure) substantially in parallel with the axial direction of the tubular body Pa. In addition, the second clasping portion Pd2 is defined by a portion of the circumferential wall of the tubular body Pa at which portions of the tubular body Pa are separated by a second slit Ph2 extending from a second end portion of the second helical groove Pg2 (i.e., a lower end portion of the second helical groove Pg2 in the figure) to a second end portion of the tubular body Pa (i.e., a lower end portion of the tubular body Pa in the figure) substantially in parallel with the axial direction of the tubular body Pa.

The first and second clasping portions Pd1 and Pd2 are configured to be symmetric with respect to a longitudinal midpoint of the tubular body Pa. Accordingly, a specific structure of only the second clasping portion Pd2 will be described below, while a description of a specific structure of the first clasping portion Pd1 will be omitted.

Figure 6A:
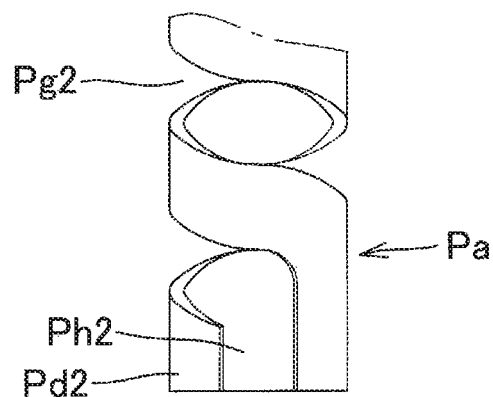
FIGS. 6A, 6B, and 6C illustrate a specific non-limiting structure of a clasping portion at an end portion of the tubular body illustrated in FIG. 5.
Figure 6B:
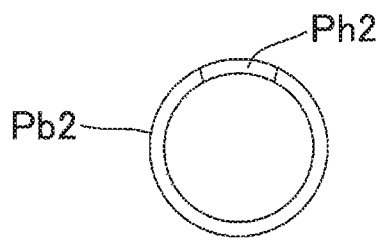
Figure 6C:
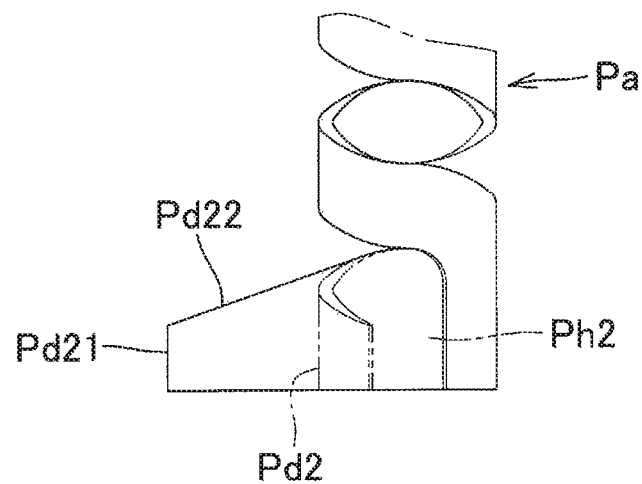

FIGS. 6A, 6B, and 6C illustrate a specific structure of the second clasping portion Pd2 at the lower end portion of the tubular body Pa. FIG. 6A is a front view illustrating the lower end portion of the tubular body Pa in an enlarged form. FIG. 6B is a bottom view of the second clasping portion Pd2 as viewed from the lower side in FIG. 6A. FIG. 6C is a front view illustrating the second clasping portion Pd2 in a developed state.

As illustrated in FIG. 6C, the second clasping portion Pd2 in the developed state has a trapezoidal shape, including an end surface Pd21 corresponding to one side of the second slit Ph2, and an inclined surface Pd22 corresponding to one side of a portion of the second helical groove Pg2. Referring to FIG. 6B, the second clasping portion Pd2 having the trapezoidal shape is bent into an arc shape to form the second clasping portion Pd2 in the shape of a C-shaped retaining ring, including a cut portion having a predetermined width, with a portion of the circumferential wall of the tubular body Pa.

Referring to FIGS. 4 and 5, the first central conductor Pb includes the first stick-shaped body Pb1, which is inserted into the first end portion of the tubular body Pa, a first clasped portion Pb2 at the proximal end portion thereof, a collar portion Pb3 configured to be contiguous with the first clasped portion Pb2, a connection portion Pb4 configured to be contiguous with the collar portion Pb3, and a first swell portion Pb6 at a distal end portion of the first stick-shaped body Pb1.

The first stick-shaped body Pb1 is configured to have an outside diameter D1 smaller than the inside diameter E1 of the tubular body Pa to allow the first stick-shaped body Pb1 to be easily inserted into the tubular body Pa. For example, in the case where the inside diameter E1 of the tubular body Pa is 100 μm, the outside diameter D1 of the first stick-shaped body Pb1 may be 92 μm. In addition, the first clasped portion Pb2, the first stick-shaped body Pb1, and the first swell portion Pb6 are configured to have such axial dimensions that the first swell portion Pb6 at a distal end portion of the first central conductor Pb will be inserted into the joining portion Pf of the tubular body Pa when the first central conductor Pb is fitted into the tubular body Pa.

The first swell portion Pb6 is configured to have an outside diameter D2 greater than the outside diameter D1 of the first stick-shaped body Pb1 and smaller than the inside diameter E1 of the tubular body Pa. In addition, a difference between the outside diameter D2 of the first swell portion Pb6 and the inside diameter E1 of the tubular body Pa is configured to be small to allow the joining portion Pf of the tubular body Pa to make slidable contact with each of the first swell portion Pb6 and a second swell portion Pc6 to establish electrical connection therebetween at the time of an inspection, which will be described below. For example, in the case where the outside diameter D1 of the first stick-shaped body Pb1 is 92 μm, and the inside diameter E1 of the tubular body Pa is 100 μm, the outside diameter D2 of the first swell portion Pb6 may be 94 μm.

The first clasped portion Pb2 is configured to have an outside diameter D3 slightly greater than the inside diameter E1 of the tubular body Pa. For example, in the case where the inside diameter E1 of the tubular body Pa is 100 μm, the outside diameter D3 of the first clasped portion Pb2 may be 103 μm. As a result, when the first stick-shaped body Pb1 is inserted and fitted into the tubular body Pa, the first clasping portion Pd1 is expanded by the first clasped portion Pb2 to allow the first central conductor Pb to be fitted in the tubular body Pa with an inner surface of the first clasping portion Pd1 being fixed to a peripheral surface of the first clasped portion Pb2 with pressure.

The collar portion Pb3 of the first central conductor Pb is configured to have an outside diameter D4 greater than the inside diameter E1 of the tubular body Pa and greater than the outside diameter D3 of the first clasped portion Pb2. For example, in the case where the inside diameter E1 of the tubular body Pa is 100 μm, and the outside diameter D3 of the first clasped portion Pb2 is 103 μm, the outside diameter D4 of the collar portion Pb3 may be 125 μm. This allows the collar portion Pb3 to be brought into contact with an end portion of the tubular body Pa to achieve positioning of the first stick-shaped body Pb1 when the first stick-shaped body Pb1 is inserted into the tubular body Pa to fit the first central conductor Pb therein.

In addition, referring to FIG. 3, the outside diameter D4 of the collar portion Pb3 of the first central conductor Pb is configured to be smaller than an inside diameter of each insert hole portion Ha of the support member 31 to allow the support member 31 to support the probe Pr when the tubular body Pa of the probe Pr has been inserted in the insert hole portions Ha. Further, the outside diameter D4 of the collar portion Pb3 is configured to be greater than an inside diameter of the decreased diameter portion Ha1 defined in the support plate 31a to prevent the first central conductor Pb from coming off the support member 31 when the probe Pr has been supported by the support member 31.

The connection portion Pb4 of the first central conductor Pb is configured to have an outside diameter D5 slightly smaller than the outside diameter D4 of the collar portion Pb3 and smaller than the inside diameter of the decreased diameter portion Ha1 defined in the support plate 31a to allow the connection portion Pb4 to be inserted in the decreased diameter portion Ha1.

In addition, the connection portion Pb4 is configured to have a total length greater than a length of the decreased diameter portion Ha1 defined in the support plate 31a to allow an end portion of the connection portion Pb4 to protrude outwardly of the support member 31 from the decreased diameter portion Ha1 when the probe Pr is supported by the support member 31. Further, a tapered portion Pb5 having a tapered shape is defined at a distal end portion of the connection portion Pb4 to allow a tip surface of the tapered portion Pb5 to make contact with the corresponding electrode 34a provided in the base plate 321 when the board 101 or the like is inspected as described below.

Meanwhile, the second central conductor Pc includes the second stick-shaped body Pc1 and a second clasped portion Pc2, which are configured to have the same shapes and outside diameters as those of the first stick-shaped body Pb1 and the first clasped portion Pb2, respectively, of the first central conductor Pb. A collar portion Pc3 is at the proximal end portion of the second stick-shaped body Pc1. The collar portion Pc3 is configured to have an outside diameter D4' greater than that of the second clasped portion Pc2 and slightly greater than that of the collar portion Pb3 of the first central conductor Pb. The outside diameter D4' is, for example, about 130 μm.

Then, an end surface of a connection portion Pc4, which is configured to be contiguous with the collar portion Pc3, is configured to be in contact with the board 101 at the time of an inspection, which will be described below. The connection portion Pc4 is configured to have an outside diameter D6 slightly smaller than the outside diameter D4' of the collar portion Pc3 and smaller than an inside diameter of the narrow portion Hb defined in the support plate 31c to allow the connection portion Pc4 to be inserted in the narrow portion Hb.

In addition, the connection portion Pc4 is configured to have a total length greater than a thickness of the support plate 31c to allow an end portion of the connection portion Pc4 to protrude outwardly of the support member 31 from the narrow portion Hb defined in the support plate 31c when the probe Pr is supported by the support member 31. Further, the end surface of the connection portion Pc4 is configured to be substantially flat.

The second clasped portion Pc2, the second stick-shaped body Pc1, and the second swell portion Pc6 are configured to have such axial dimensions that the second swell portion Pc6 will be inserted in the joining portion Pf of the tubular body Pa when the second central conductor Pc is fitted into the tubular body Pa.

In addition, the first stick-shaped body Pb1, the second stick-shaped body Pc1, and so on are configured to have such total lengths that a predetermined gap KG will be defined between a distal end surface of the first swell portion Pb6 and a distal end surface of the second swell portion Pc6 as illustrated in FIG. 4 when the first and second central conductors Pb and Pc have been fitted into the tubular body Pa.

Further, the first stick-shaped body Pb1, the second stick-shaped body Pc1, and so on are configured to have such axial dimensions that the distal end surface of the first swell portion Pb6 and the distal end surface of the second swell portion Pc6 will be kept opposite to each other with a predetermined gap therebetween even when each of the connection portion Pb4 of the first central conductor Pb and the connection portion Pc4 of the second central conductor Pc has been pressed into the support member 31 (see FIG. 8) at the time of an inspection, which will be described below.

A length α (see FIG. 4) of a body portion of the probe Pr, which is inserted and supported in the insert hole portions Ha defined in the support plates 31a and 31b, i.e., a sum of the total length of the tubular body Pa, the axial dimension of the collar portion Pb3 of the first central conductor Pb, and the axial dimension of the collar portion Pc3 of the second central conductor Pc, may be configured to be equal to an insert hole length β (see FIG. 3), which is a sum of the total length of the insert hole portion Ha defined in the support plate 31a and the total length of the insert hole portion Ha defined in the support plate 31b.

Specifically, when the length α of the body portion of the probe Pr is configured to be greater than the insert hole length β of the support plates 31a and 31b, the probe Pr needs to be attached to the support member 31 with the first and second spring portions Pe1 and Pe2 of the tubular body Pa being compressed by a length corresponding to a difference between the length α and the insert hole length β (i.e., α−β). This arrangement may be advantageous in that the probe Pr can be stably held without shakiness in the insert hole portions Ha of the support plates 31a and 31b.

Meanwhile, arranging the length α of the body portion of the probe Pr to be smaller than the insert hole length β of the support plates 31a and 31b may be advantageous in that the probe Pr can be easily attached to the support member 31 without the need to compress the first and second spring portions Pe1 and Pe2 of the tubular body Pa. On the other hand, this arrangement makes it difficult to stably hold the probe Pr in the insert hole portions Ha of the support plates 31a and 31b because, when the probe Pr has been attached to the support member 31, a gap is inevitably defined between the body portion of the probe Pr and a wall of the insert hole portion Ha of the support plate 31b, which easily leads to a shakiness of the probe Pr.

In contrast, arranging the length α of the body portion of the probe Pr and the insert hole length β of the support plates 31a and 31b to be equal to each other may be advantageous in that the operation of attaching the probe Pr to the support member 31 is facilitated, and in that a shakiness of the probe Pr attached to the support member 31 can be prevented.

FIG. 7 is a schematic sectional view illustrating an example structure of the inspection jig 3, and illustrates a situation in which the base plate 321 has been attached to the support plate 31a of the support member 31.

Referring to FIG. 3, a first end portion of the connection portion Pb4 of each first central conductor Pb slightly protrudes from the support plate 31a before the base plate 321 is attached to the support member 31. Then, referring to FIG. 7, when the base plate 321 is attached to the first-end side (i.e., the upper side in FIG. 7) of the support plate 31a, a first end portion of each first central conductor Pb, i.e., an upper end surface of each tapered portion Pb5, is brought into contact with the corresponding electrode 34a in the base plate 321, and is pressed toward a second-end side of the support member 31.

As a result, the first and second spring portions Pe1 and Pe2 of the tubular body Pa are compressed and elastically deformed, and thus, protruding portions of the connection portion Pb4 and the tapered portion Pb5 are pressed into the support member 31 against forces from the first and second spring portions Pe1 and Pe2. In addition, the first end portion of each probe Pr, i.e., the upper end surface of the tapered portion Pb5 thereof, is pressed against the corresponding electrode 34a in accordance with the forces from the first and second spring portions Pe1 and Pe2, so that the first end portion of the probe Pr and the corresponding electrode 34a are kept in stable electrical contact with each other.

Note that the tapered portion Pb5 having the tapered shape may not necessarily be defined at an upper end portion of the connection portion Pb4, and that an upper end surface of the connection portion Pb4 may alternatively be configured to be flat.

Figure 8:
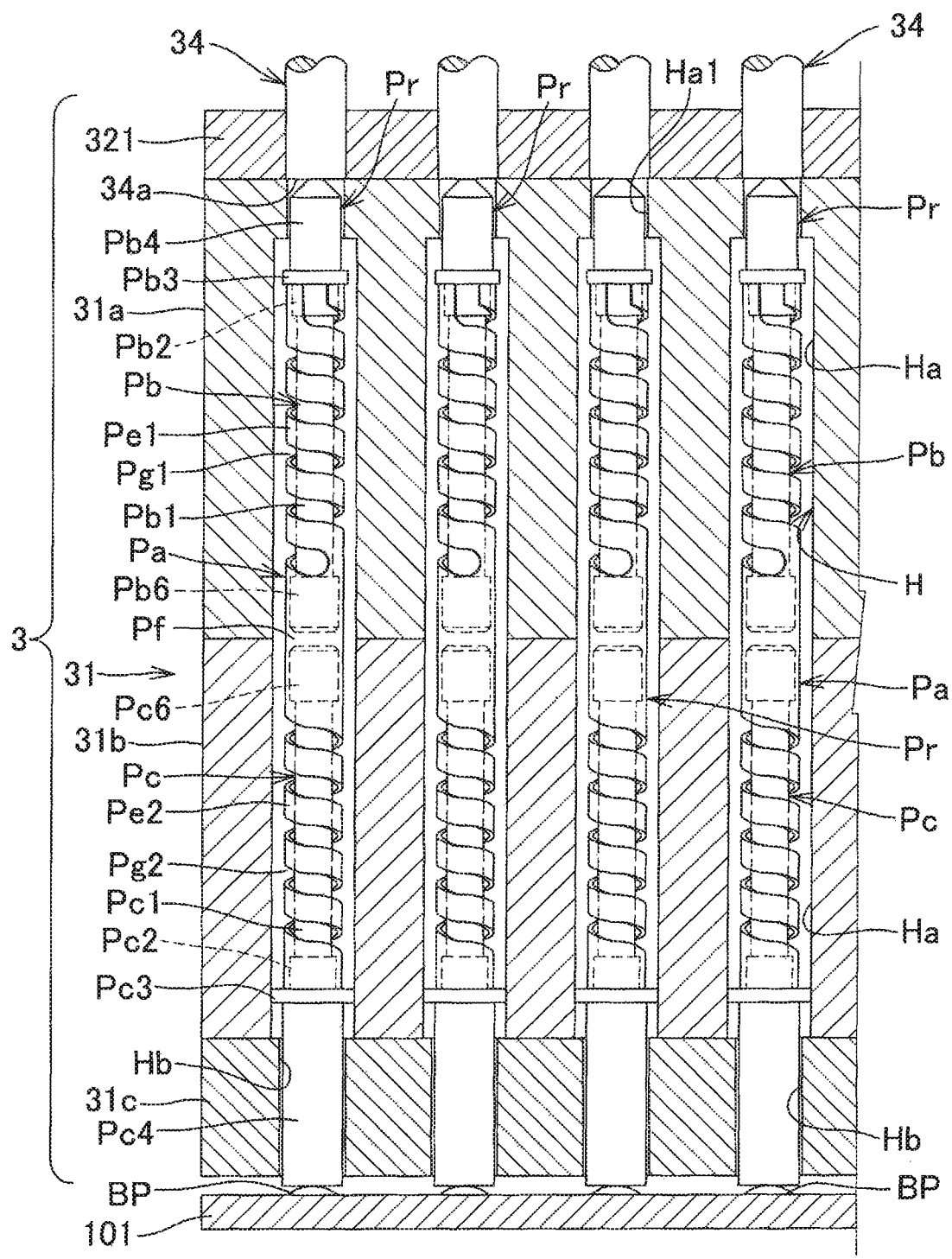
FIG. 8 is a diagram corresponding to FIG. 3, and illustrates a situation in which an inspection target is inspected with each probe being pressed against the inspection target.
Figure 9:
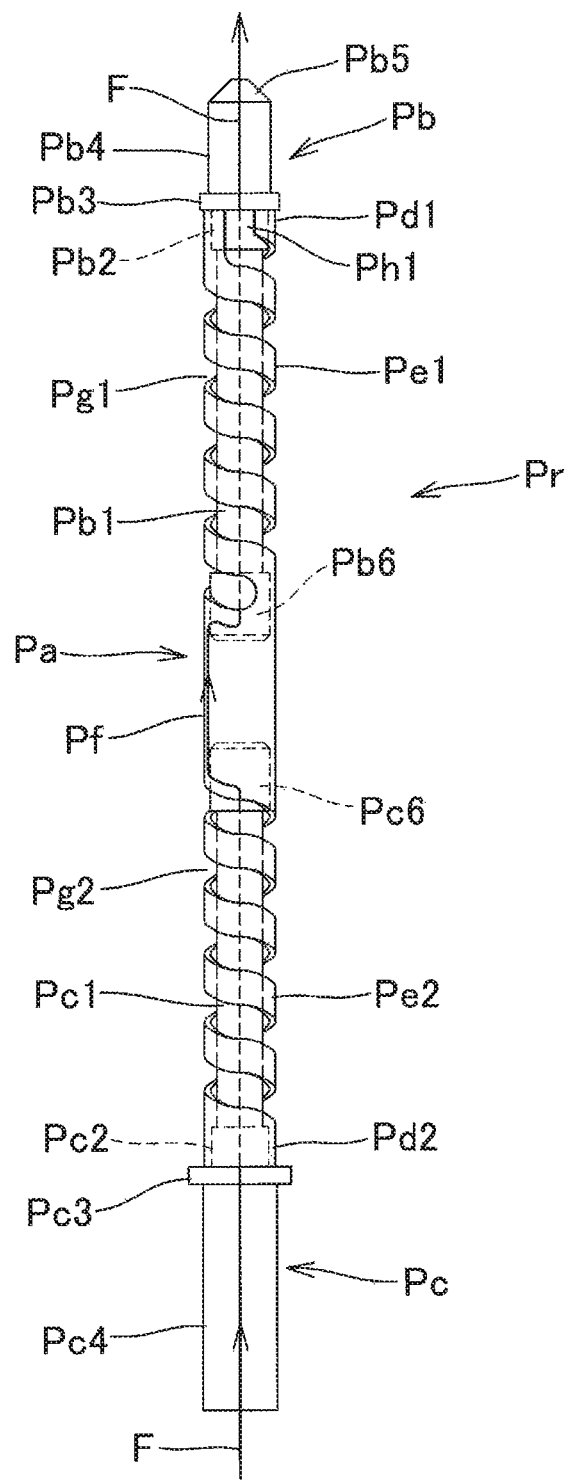
FIG. 9 is an explanatory diagram illustrating the contact terminal according to the first non-limiting embodiment of the present disclosure in an energized state.
Figure 10:
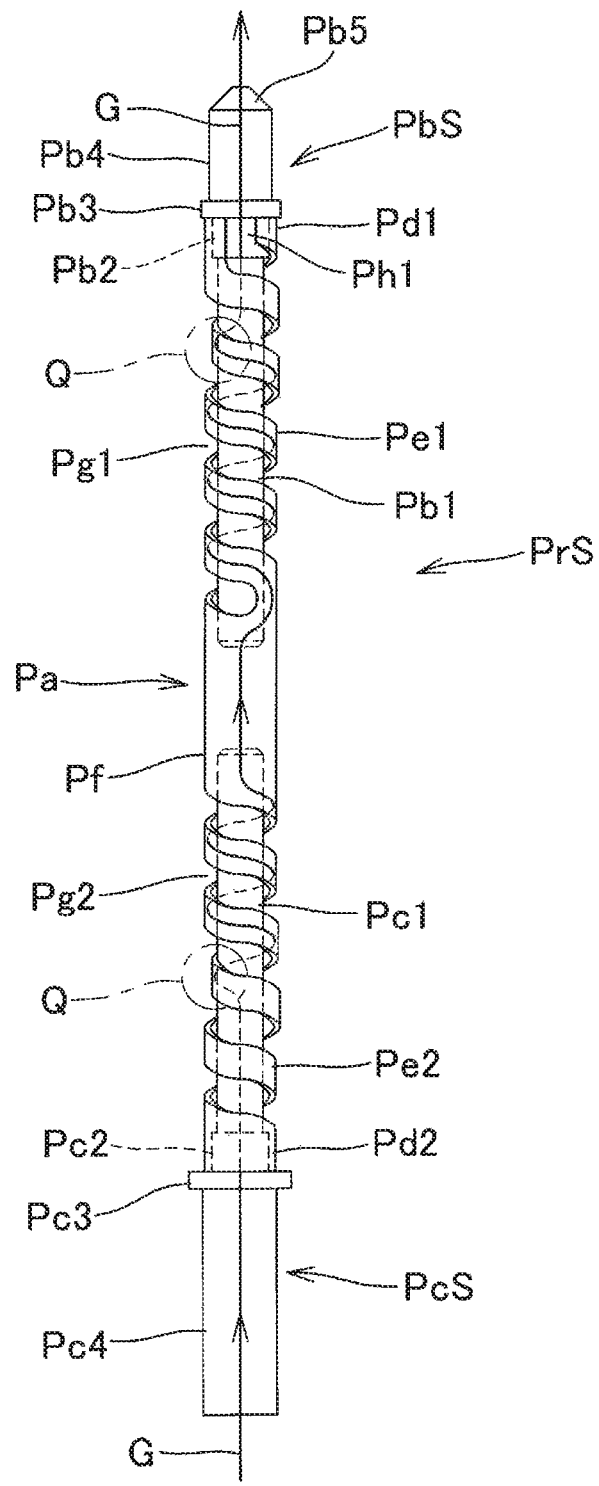
FIG. 10 is an explanatory diagram illustrating a contact terminal according to a comparative example of the present disclosure in an energized state.

FIG. 8 is a schematic sectional view illustrating a situation in which the board 101, which is the inspection target, is inspected with a second end portion of each probe Pr being pressed against a corresponding bump BP of the board 101. FIG. 9 is an explanatory diagram illustrating a contact terminal according to a non-limiting embodiment of the present disclosure in an energized state. FIG. 10 is an explanatory diagram illustrating a contact terminal according to a comparative example of the present disclosure in an energized state.

At the time of inspecting the board 101 or the like using the probes Pr, if the inspection jig 3 is pressed against the board 101 with the support member 31 being positioned with respect to the board 101, the connection portion Pc4 of the second central conductor Pc, which is at the second end portion of each probe Pr, is brought into contact with the corresponding bump BP of the board 101, and is pressed toward the first-end side of the support member 31.

As a result, the first and second spring portions Pe1 and Pe2 of the tubular body Pa are further compressed and elastically deformed, and thus, a protruding portion of the connection portion Pc4 is pressed toward the first-end side of the support member 31 against the forces from the first and second spring portions Pe1 and Pe2. Then, with a surface of each probe Pr on the second-end side, i.e., a lower end surface of the connection portion Pc4 of each probe Pr, being pressed against the corresponding bump BP of the board 101 in accordance with the forces from the first and second spring portions Pe1 and Pe2, the second end portion of each probe Pr and the corresponding inspection point (i.e., the corresponding bump BP) in the board 101 are kept in stable electrical contact with each other.

As described above, each probe Pr includes the tubular body Pa being tubular and made of the electrically conductive material, and the first and second central conductors Pb and Pc each of which is in the shape of a stick and is made of the electrically conductive material. In addition, the first and second central conductors Pb and Pc include the first and second stick-shaped bodies Pb1 and Pc1, respectively, which are inserted in the tubular body Pa, while the tubular body Pa includes the first and second spring portions Pe1 and Pe2 each of which is defined by a helical body extending along the peripheral surface of the tubular body Pa, and the first and second clasping portions Pd1 and Pd2 configured to clasp the proximal end portions of the first and second stick-shaped bodies Pb1 and Pc1, respectively. The above structure of the probe Pr (i.e., the contact terminal) contributes to reducing the possibility of increased inductance or impedance in the probe Pr. Thus, by using the probe Pr, an inspection jig and an inspection apparatus are able to easily achieve improved inspection accuracy.

Specifically, the first and second swell portions Pb6 and Pc6, each of which is configured to have a diameter greater than that of each of the first and second stick-shaped bodies Pb1 and Pc1, are at the distal end portions of the first and second central conductors Pb and Pc, respectively. Thus, at the time of inspecting the board 101 using the probes Pr, for example, each of the first and second swell portions Pb6 and Pc6 is brought into contact with the joining portion Pf of the tubular body Pa with high reliability. This contributes to preventing each of the first and second spring portions Pe1 and Pe2 of the tubular body Pa from being energized, and reducing the possibility of increased inductance or impedance.

FIG. 10 illustrates a probe PrS according to a reference example, which includes neither of the first and second swell portions Pb6 and Pc6. When the board 101 is inspected using the probe PrS, for example, there is a possibility that a tubular body Pa will be deformed to bring an intermediate portion Q of a first stick-shaped body Pb1 into contact with a first spring portion Pe1, and bring an intermediate portion Q of a second stick-shaped body Pc1 into contact with a second spring portion Pe2.

Accordingly, as indicated by a current path G, an electric current entering a connection portion Pc4 of a second central conductor PcS may pass from the second stick-shaped body Pc1 to a connection portion Pb4 of a first central conductor PbS through the second spring portion Pe2, a joining portion Pf, the first spring portion Pe1, and the first stick-shaped body Pb1. Passing of the electric current through each of the first and second spring portions Pe1 and Pe2 will allow the spring portion to act as a coil, resulting in increased inductance of the probe. In addition, a lengthening of a current path due to inclusion of portions of the spring portions therein may result in increased electrical resistance, i.e., increased impedance.

In contrast, in the case of the probe Pr as illustrated in FIG. 9, which includes the first and second clasped portions Pb2 and Pc2 and the first and second swell portions Pb6 and Pc6, each of which is configured to have a diameter greater than that of each of the first and second stick-shaped bodies Pb1 and Pc1, a predetermined gap is secured between an inner circumferential surface of the tubular body Pa and each of the first and second stick-shaped bodies Pb1 and Pc1.

Accordingly, as indicated by a current path F in FIG. 9, an electric current entering the connection portion Pc4 of the second central conductor Pc passes to the connection portion Pb4 substantially in a straight line through the second stick-shaped body Pc1, the second swell portion Pc6, the joining portion Pf, the first swell portion Pb6, and the first stick-shaped body Pb1, and there is a limited possibility that the electric current will pass from the first stick-shaped body Pb1 to the first spring portion Pe1 or from the second stick-shaped body Pc1 to the second spring portion Pe2 as indicated by the current path G illustrated in FIG. 10.

In addition, the first and second central conductors Pb and Pc are provided separately, and the first and second clasping portions Pd1 and Pd2 at both end portions of the tubular body Pa are configured to clasp the first and second clasped portions Pb2 and Pc2, respectively, each of which is configured to have a diameter greater than that of each of the first and second stick-shaped bodies Pb1 and Pc1. Accordingly, when compared to the case where a single central conductor is fitted in the tubular body Pa, each of the first and second stick-shaped bodies Pb1 and Pc1, which form central conductors, can be configured to have a small total length, and the first and second stick-shaped bodies Pb1 and Pc1 can be easily inserted into the tubular body Pa through both end portions thereof to fit the first and second central conductors Pb and Pc in the tubular body Pa.

Further, the first and second central conductors Pb and Pc are arranged to have a distal end portion of each of the first and second swell portions Pb6 and Pc6 inserted into the joining portion Pf of the tubular body Pa. Accordingly, when the first and second central conductors Pb and Pc have been fitted in the tubular body Pa, the tubular body Pa is almost entirely reinforced by the first and second stick-shaped bodies Pb1 and Pc1, ensuring sufficient mechanical strength of the probe Pr.

Furthermore, when the board 101 or the like is inspected using the probes Pr, the first and second swell portions Pb6 and Pc6 are configured such that the distal end surfaces of the first and second swell portions Pb6 and Pc6 are kept opposite to each other with a gap therebetween to prevent a contact between the distal end portion of the first swell portion Pb6 and the distal end portion of the second swell portion Pc6 (see FIG. 8), and this contributes to preventing a compression of each of the first and second spring portions Pe1 and Pe2 from being interrupted.

In addition, in the case where the outside diameter D3 of each of the first and second clasped portions Pb2 and Pc2 is configured to be slightly greater than the inside diameter E1 of the tubular body Pa as in the first non-limiting embodiment, each of the first and second central conductors Pb and Pc can be stably clasped with the first and second clasping portions Pd1 and Pd2 being fixed to the peripheral surfaces of the first and second clasped portions Pb2 and Pc2, respectively, with pressure.

Note that it is conceivable to arrange the outside diameter D3 of each of the first and second clasped portions Pb2 and Pc2 to be equal to or smaller than the inside diameter E1 of the tubular body Pa, and join the first and second clasping portions Pd1 and Pd2 to the first and second clasped portions Pb2 and Pc2, respectively, by another joining method, such as, for example, welding or crimping. In this case, however, a troublesome joining operation would be required, and it is therefore desirable that the outside diameter D3 of each of the first and second clasped portions Pb2 and Pc2 is configured to be slightly greater than the inside diameter E1 of the tubular body Pa as in the above-described first non-limiting embodiment.

Further, in the case where the first slit Ph1, which is configured to separate portions of the tubular body Pa in the circumferential direction, is defined in the first clasping portion Pd1, the first clasped portion Pb2 can be easily press fitted into the first clasping portion Pd1 of the tubular body Pa by spreading the first slit Ph1 and thus elastically deforming the first clasping portion Pd1 when the first stick-shaped body Pb1 is inserted and fitted into the first end portion of the tubular body Pa. In addition, because the first clasping portion Pd1 is fixed to the peripheral surface of the first clasped portion Pb2 with pressure in accordance with resilience of the first clasping portion Pd1, the fitting of the first central conductor Pb to the tubular body Pa can be stably maintained with the first clasping portion Pd1 clasping the first clasped portion Pb2.

Similarly, in the case where the second slit Ph2, which is configured to separate portions of the tubular body Pa in the circumferential direction, is defined in the second clasping portion Pd2, the second clasped portion Pc2 can be easily press fitted into the second clasping portion Pd2 of the tubular body Pa by spreading the second slit Ph2 and thus elastically deforming the second clasping portion Pd2 when the second stick-shaped body Pc1 is inserted and fitted into the second end portion of the tubular body Pa. In addition, because the second clasping portion Pd2 is fixed to the peripheral surface of the second clasped portion Pc2 with pressure in accordance with resilience of the second clasping portion Pd2, the fitting of the second central conductor Pc to the tubular body Pa can be stably maintained with the second clasping portion Pd2 clasping the second clasped portion Pc2.

In addition, in the case where the first slit Ph1, which is defined in the first clasping portion Pd1, is configured to be contiguous with an end portion of the first helical groove Pg1, which defines the first spring portion Pe1, and extends in the axial direction of the tubular body Pa, and the second slit Ph2, which is defined in the second clasping portion Pd2, is configured to be contiguous with an end portion of the second helical groove Pg2, which defines the second spring portion Pe2, and extends in the axial direction of the tubular body Pa as described above, the first and second slits Ph1 and Ph2 can be easily defined contiguously with the first and second helical grooves Pg1 and Pg2, respectively, when, for example, the laser beam is emitted from the laser beam machine onto the peripheral surface of the tubular body Pa to define the first and second helical grooves Pg1 and Pg2.

Note that, although each of the first and second slits Ph1 and Ph2 is configured to extend substantially in parallel with the axial direction of the tubular body Pa in the above-described first non-limiting embodiment, each of the first and second slits Ph1 and Ph2 may alternatively be configured to extend at a predetermined angle with respect to the axial direction of the tubular body Pa.

Further, in the case where the outside diameter D2 of each of the first and second swell portions Pb6 and Pc6 is configured to be slightly smaller than the inside diameter E1 of the tubular body Pa as described above, each of the first and second swell portions Pb6 and Pc6 can be smoothly inserted and fitted into the tubular body Pa when the first and second central conductors Pb and Pc are fitted into the tubular body Pa.

Note that the collar portion Pb3 of the first central conductor Pb and the collar portion Pc3 of the second central conductor Pc may be omitted. However, provision of the collar portions Pb3 and Pc3 enables the first and second central conductors Pb and Pc to be positioned through the collar portions Pb3 and Pc3 when the first and second stick-shaped bodies Pb1 and Pc1 are inserted into the tubular body Pa to fit the first and second central conductors Pb and Pc therein, thus facilitating this fitting operation.

Figure 11:
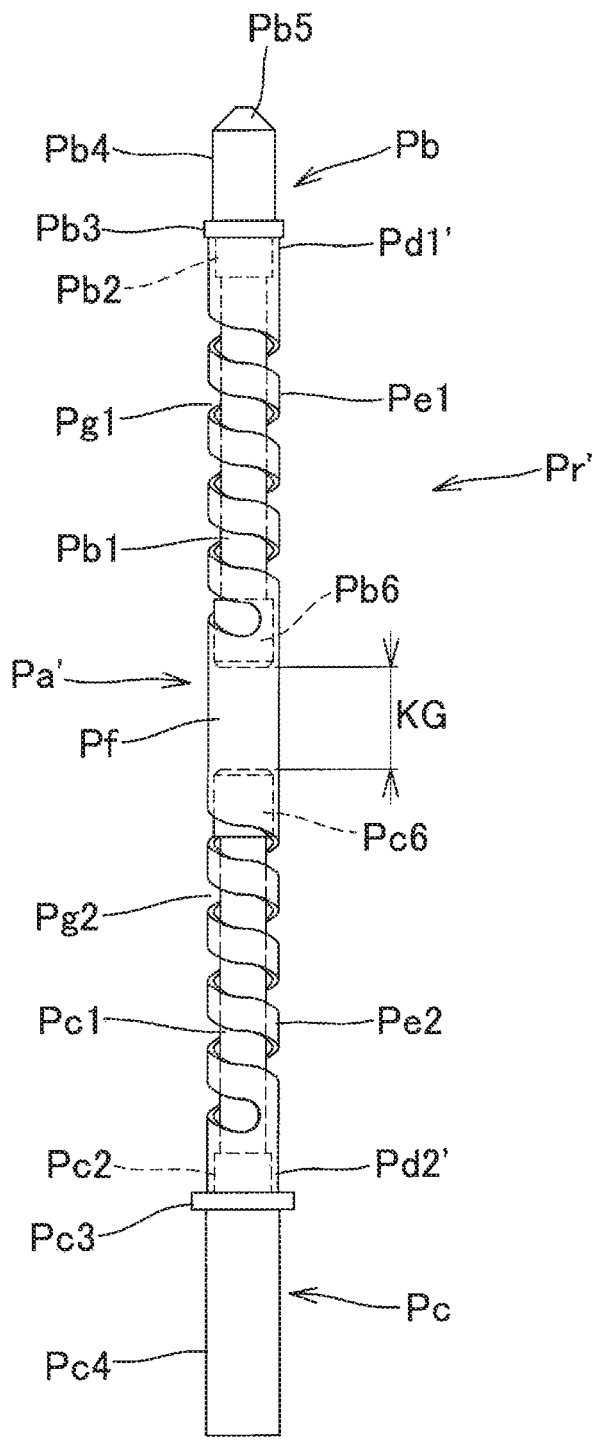
FIG. 11 is a diagram corresponding to FIG. 4, and illustrates an example probe according to a second non-limiting embodiment of the present disclosure.

FIG. 11 is a front view illustrating an example structure of a probe Pr' according to a second non-limiting embodiment of the present disclosure.

The probe Pr' includes first and second central conductors Pb and Pc, which are similar in structure to the first and second central conductors Pb and Pc according to the first non-limiting embodiment, and a tubular body Pa', which is substantially similar in structure to the tubular body Pa according to the first non-limiting embodiment except that the first and second slits Ph1 and Ph2 are not defined in both end portions of the tubular body Pa'.

The tubular body Pa' includes first and second spring portions Pe1 and Pe2, which are defined by first and second helical grooves Pg1 and Pg2, respectively, and a joining portion Pf between the first and second spring portions Pe1 and Pe2. In addition, both end portions of the tubular body Pa' include clasping portions defined by circumferential walls thereof, i.e., a first clasping portion Pd1' and a second clasping portion Pd2', respectively, each of which is tubular and does not include a cut portion as mentioned above.

When the first and second central conductors Pb and Pc are fitted into the tubular body Pa', a first stick-shaped body Pb1 and a first swell portion Pb6 are inserted into the tubular body Pa', and a second stick-shaped body Pc1 and a second swell portion Pc6 are inserted into the tubular body Pa'.

Then, first and second clasped portions Pb2 and Pc2 are press fitted into the first and second clasping portions Pd1' and Pd2' of the tubular body Pa', respectively, and the first and second clasping portions Pd1' and Pd2' are fixed to peripheral surfaces of the first and second clasped portions Pb2 and Pc2, respectively, with pressure with each of the first and second clasping portions Pd1' and Pd2' being expanded, for example. As a result, the first and second clasped portions Pb2 and Pc2 are clasped by the first and second clasping portions Pd1' and Pd2', respectively.

In addition, the first and second stick-shaped bodies Pb1 and Pc1 and so on are configured to have such total lengths that a predetermined gap KG will be defined between a distal end surface of the first central conductor Pb and a distal end surface of the second central conductor Pc as illustrated in FIG. 11 when the first and second central conductors Pb and Pc have been fitted into the tubular body Pa'.

The above structure also allows a contact terminal used to inspect a semiconductor device or the like to be easily and properly manufactured with the first clasped portion Pb2 of the first stick-shaped body Pb1 being clasped by the first clasping portion Pd1' of the tubular body Pa', and the second clasped portion Pc2 of the second stick-shaped body Pc1 being clasped by the second clasping portion Pd2' of the tubular body Pa'. In addition, for example, the above structure also makes it possible to bring the contact terminal into contact with an inspection point in the semiconductor device or the like and an electrode of a wire or the like with proper contact pressures through elastic deformation of the first and second spring portions Pe1 and Pe2 of the tubular body Pa'.

Note that only one of the first and second slits Ph1 and Ph2 may be omitted, with the other one of the first and second slits Ph1 and Ph2 being defined in the tubular body Pa'.

While exemplary embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A contact terminal comprising:
  a tubular body made of an electrically conductive material; and
  a first central conductor and a second central conductor each of which is made of an electrically conductive material, and is in a shape of a rod; wherein
  the first central conductor comprises:
    a first rod-shaped body configured to have an outside diameter smaller than an inside diameter of the tubular body, and to be inserted into a first end portion of the tubular body;
    a first clasped portion at a proximal end portion of the first rod-shaped body, and having a diameter greater than that of the first rod-shaped body; and
    a first swell portion at a distal end portion of the first rod-shaped body, and having a diameter greater than that of the first rod-shaped body;
  the second central conductor includes:
    a second rod-shaped body configured to have an outside diameter smaller than the inside diameter of the tubular body, and to be inserted into a second end portion of the tubular body;
    a second clasped portion at a proximal end portion of the second rod-shaped body, and configured to have a diameter greater than that of the second rod-shaped body; and
    a second swell portion at a distal end portion of the second rod-shaped body, and having a diameter greater than that of the second rod-shaped body;
  the tubular body comprises:
    a first clasping portion configured to clasp the first clasped portion;
    a second clasping portion configured to clasp the second clasped portion;
    a first spring portion defined by a helical body contiguous with the first clasping portion;
    a second spring portion defined by a helical body contiguous with the second clasping portion; and
    a tubular joining portion configured to join the first and second spring portions to each other; and
  the first and second central conductors are configured to have a distal end portion of each of the first and second swell portions inserted into the joining portion, and to have a distal end surface of the first swell portion and a distal end surface of the second swell portion kept opposite to each other with a gap therebetween.

2. The contact terminal according to claim 1, wherein the first and second clasping portions comprise inner surfaces fixed to peripheral surfaces of the first and second clasped portions, respectively, with pressure.

3. The contact terminal according to claim 1, wherein at least one of the first and second clasping portions includes a slit configured to separate portions of the tubular body in a circumferential direction.

4. The contact terminal according to claim 2, wherein at least one of the first and second clasping portions includes a slit configured to separate portions of the tubular body in a circumferential direction.

5. The contact terminal according to claim 3, wherein the slit extends in an axial direction of the tubular body from an end portion of a helical groove defining the helical body.

6. The contact terminal according to claim 4, wherein the slit extends in an axial direction of the tubular body from an end portion of a helical groove defining the helical body.

7. An inspection jig comprising:
  a contact terminal comprising:
    a tubular body made of an electrically conductive material; and
    a first central conductor and a second central conductor each of which is made of an electrically conductive material, and is in a shape of a rod; wherein the first central conductor comprises:
      a first rod-shaped body configured to have an outside diameter smaller than an inside diameter of the tubular body, and to be inserted into a first end portion of the tubular body;
      a first clasped portion at a proximal end portion of the first rod-shaped body, and having a diameter greater than that of the first rod-shaped body; and
      a first swell portion at a distal end portion of the first rod-shaped body, and having a diameter greater than that of the first rod-shaped body; the second central conductor includes:
      a second rod-shaped body configured to have an outside diameter smaller than the inside diameter of the tubular body, and to be inserted into a second end portion of the tubular body;
      a second clasped portion at a proximal end portion of the second rod-shaped body, and configured to have a diameter greater than that of the second rod-shaped body; and a second swell portion at a distal end portion of the second rod-shaped body, and having a diameter greater than that of the second rod-shaped body;

the tubular body comprises:
 a first clasping portion configured to clasp the first clasped portion;
 a second clasping portion configured to clasp the second clasped portion;
 a first spring portion defined by a helical body contiguous with the first clasping portion;
 a second spring portion defined by a helical body contiguous with the second clasping portion; and
 a tubular joining portion configured to join the first and second spring portions to each other; and the first and second central conductors are configured to have a distal end portion of each of the first and second swell portions inserted into the joining portion, and to have a distal end surface of the first swell portion and a distal end surface of the second swell portion kept opposite to each other with a gap therebetween; and the inspection jig further comprising a support member configured to support the contact terminal.

8. The inspection jig of claim 7,
wherein the first and second clasping portions comprise inner surfaces fixed to peripheral surfaces of the first and second clasped portions, respectively, with pressure.

9. The inspection jig of claim 7,
wherein at least one of the first and second clasping portions includes a slit configured to separate portions of the tubular body in a circumferential direction.

10. The inspection jig of claim 8,
wherein at least one of the first and second clasping portions includes a slit configured to separate portions of the tubular body in a circumferential direction.

11. The inspection jig of claim 9,
wherein the slit extends in an axial direction of the tubular body from an end portion of a helical groove defining the helical body.

12. The inspection jig of claim 10,
wherein the slit extends in an axial direction of the tubular body from an end portion of a helical groove defining the helical body.

13. An inspection apparatus comprising:
an inspection jig comprising:
 a contact terminal comprising:
  a tubular body made of an electrically conductive material; and
  a first central conductor and a second central conductor each of which is made of an electrically conductive material, and is in a shape of a rod;
 wherein the first central conductor comprises:
  a first rod-shaped body configured to have an outside diameter smaller than an inside diameter of the tubular body, and to be inserted into a first end portion of the tubular body;
  a first clasped portion at a proximal end portion of the first rod-shaped body, and having a diameter greater than that of the first rod-shaped body; and
  a first swell portion at a distal end portion of the first rod-shaped body, and having a diameter greater than that of the first rod-shaped body;

the second central conductor includes:
 a second rod-shaped body configured to have an outside diameter smaller than the inside diameter of the tubular body, and to be inserted into a second end portion of the tubular body;
 a second clasped portion at a proximal end portion of the second rod-shaped body, and configured to have a diameter greater than that of the second rod-shaped body; and
 a second swell portion at a distal end portion of the second rod-shaped body, and having a diameter greater than that of the second rod-shaped body;

the tubular body comprises:
 a first clasping portion configured to clasp the first clasped portion;
 a second clasping portion configured to clasp the second clasped portion;
 a first spring portion defined by a helical body contiguous with the first clasping portion;
 a second spring portion defined by a helical body contiguous with the second clasping portion; and
 a tubular joining portion configured to join the first and second spring portions to each other; and the first and second central conductors are configured to have a distal end portion of each of the first and second swell portions inserted into the joining portion, and to have a distal end surface of the first swell portion and a distal end surface of the second swell portion kept opposite to each other with a gap therebetween; and a support member configured to support the contact terminal; and the inspection apparatus further comprising an inspection processing portion configured to inspect an inspection target on a basis of an electrical signal from contact between the contact terminal and an inspection point in the inspection target.

14. The inspection apparatus of claim 13,
wherein the first and second clasping portions comprise inner surfaces fixed to peripheral surfaces of the first and second clasped portions, respectively, with pressure.

15. The inspection apparatus of claim 13,
wherein at least one of the first and second clasping portions includes a slit configured to separate portions of the tubular body in a circumferential direction.

16. The inspection apparatus of claim 14,
wherein at least one of the first and second clasping portions includes a slit configured to separate portions of the tubular body in a circumferential direction.

17. The inspection apparatus of claim 15,
wherein the slit extends in an axial direction of the tubular body from an end portion of a helical groove defining the helical body.

18. The inspection apparatus of claim 16,
wherein the slit extends in an axial direction of the tubular body from an end portion of a helical groove defining the helical body.

* * * * *